United States Patent [19]

Kamitani

[11] Patent Number: 5,036,295
[45] Date of Patent: Jul. 30, 1991

[54] FREQUENCY SYNTHESIZER ALLOWING RAPID FREQUENCY SWITCHING

[75] Inventor: Toshiki Kamitani, Hyogo, Japan

[73] Assignee: Mitsubishi Denki Kabushiki Kaisha, Tokyo, Japan

[21] Appl. No.: 559,040

[22] Filed: Jul. 30, 1990

[30] Foreign Application Priority Data

Aug. 10, 1989 [JP] Japan .................................. 1-207347
May 16, 1990 [JP] Japan .................................. 2-126114

[51] Int. Cl.$^5$ ..................... H03L 7/085; H03L 7/18
[52] U.S. Cl. .................................... 331/10; 331/14; 331/16; 331/17; 331/25; 331/36 C; 455/183
[58] Field of Search ............... 331/1 A, 10, 14, 16, 331/17, 25, 36 C; 455/183

[56] References Cited

U.S. PATENT DOCUMENTS 4,511,858 4/1985 Charavit et al. .................. 331/10
4,562,410 12/1985 O'Rourke ............................ 331/1 A

FOREIGN PATENT DOCUMENTS

57-160227 10/1982 Japan .

Primary Examiner—Siegfried H. Grimm
Attorney, Agent, or Firm—Rothwell, Figg, Ernst & Kurz

[57] ABSTRACT

A frequency synthesizer is designed to modify voltage value data read out of a memory in accordance with the output voltage of a filter, and apply a d.c. voltage corresponding to the modified data to a second variable-capacitance diode at the control input of a VCO, thereby allowing the VCO frequency switching without imposing a significant fluctuation of the application voltage to a first variable-capacitance diode and accomplishing a short channel switching time and stable operation against temperature fluctuation. The device is further designed to supply a voltage setup value read out of the memory to the second variable-capacitance diode thereby to reduce the frequency matching time at channel switching, and to determine such another voltage setup value as to reduce the time of phase matching based on the trend of change in the filter output voltage and supply the value to the second variable-capacitance diode.

12 Claims, 6 Drawing Sheets

FREQUENCY SYNTHESIZER ALLOWING RAPID FREQUENCY SWITCHING

BACKGROUND OF THE INVENTION

1. Field of the Invention

The present invention relates to a frequency synthesizer based on the phase-locked loop (will be termed PLL hereinafter) scheme.

2. Description of the Prior Art

Figure 1:
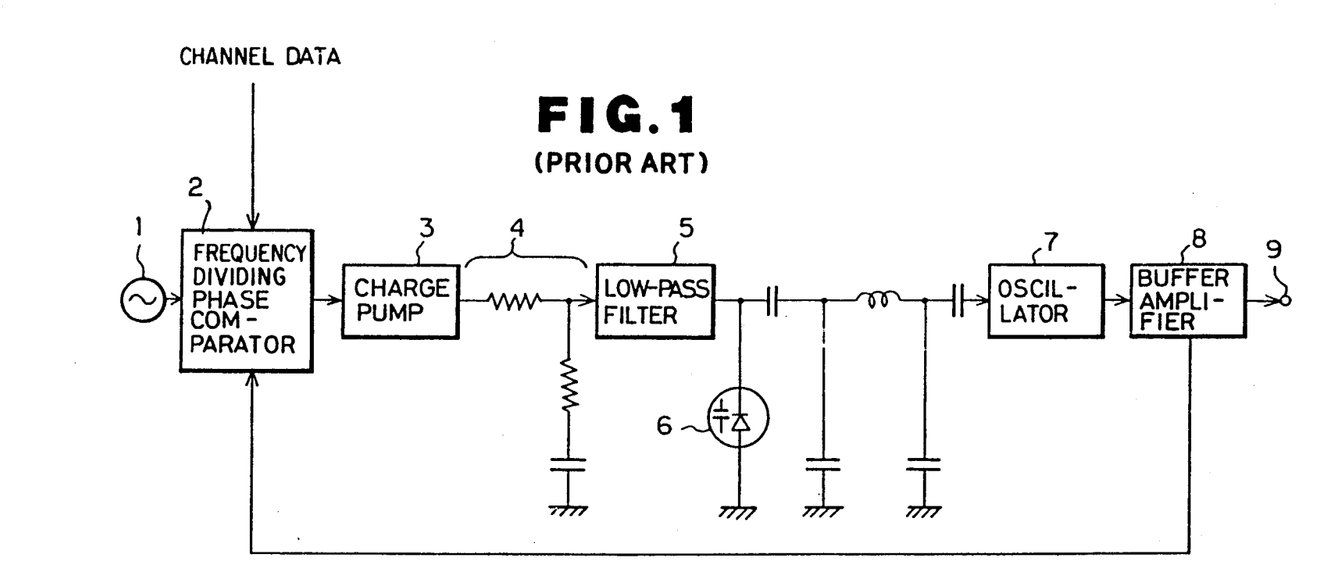
FIG. 1 is a block diagram showing a conventional frequency synthesizer.

FIG. 1 is a block diagram showing a conventional frequency synthesizer. In the figure, indicated by 1 is a reference signal oscillator, and 2 is a frequency-dividing phase comparator which compares the phase of a signal derived from the output signal of the frequency synthesizer divided by a factor determined by the input channel data, with the phase of reference signal provided by the reference signal oscillator 1. 3 is a charge pump which generates pulses in accordance with a phase difference signal produced by the dividing phase comparator 2. 4 and 5 are a lag-lead filter and a low-pass filter, respectively, which function to smooth the pulses produced by the charge pump 3.

Indicated by 6 is a first variable-capacitance diode which varies its capacitance in response to the output voltage of the low-pass filter 5, 7 is an oscillator which oscillates at a frequency determined by the capacitance of the first variable-capacitance diode 6, the variable-capacitance diode 6 and oscillator 7 in combination constituting a voltage-controlled oscillator (will be termed VCO hereinafter). 8 is a buffer amplifier for amplifying the output of the oscillator 7, and 9 is an output terminal from which the amplified output of the buffer amplifier 8 is delivered. The output signal of the buffer amplifier 8 is, at the same time, partly fed back to the frequency dividing phase comparator 2.

Next, the operation of the foregoing arrangement will be explained. The output signal fed back from the buffer amplifier 8 is divided by the factor specified by the channel data by the dividing phase comparator 2, and the phase of resulting signal is compared in phase with the phase of the reference signal provided by the reference signal oscillator 1. The phase difference signal resulting from the phase comparison by the phase comparator 2 is fed to the charge pump 3, which then generates pulses in accordance with the received phase difference signal and sends the pulses to the lag-lead filter 4. The pulses generated by the charge pump 3 are smoothed by the lag-lead filter 4 and low-pass filter 5 into a predetermined d.c. voltage, which is applied to the first variable-capacitance diode 6.

The variable-capacitance diode 6 has its capacitance value established in correspondence with the d.c. voltage supplied from the low-pass filter 5, and the oscillator 7 oscillates at a frequency which is determined by the capacitance of the first variable-capacitance diode 6. The output of the oscillator 7 is amplified by the buffer amplifier 8, and the amplified signal is delivered from the output terminal 9 and, at the same time, fed back to the phase comparator 2. The phase-locked loop system operates such that the phase difference as determined by the demultiplying phase comparator 2 ultimately is reduced to zero, and consequently the VCO made up of the variable-capacitance diode 6 and oscillator 7 has its oscillation frequency stabilized at to a certain value. This state of operation is called "a locked state".

The conventional frequency synthesizer, arranged as described above, needs a substantial amount of time for frequency matching in the phase lock process, which is dependent on the time constant of the lag-lead filter 4. Therefore it cannot achieve a quick variation of the voltage applied to the first variable-capacitance diode 6 at the switching of frequencies, resulting adversely in an excessive time delay for channel switching, and it exhibits a problem of being deficient as a frequency synthesizer used in digital radio communications equipment in which frequency "hopping" is required.

An example of a scheme which copes with this problem is described in Japanese Patent Unexamined Publication No. 57-160227, however, it still involves a problem of prolonged switching time due to the temperature fluctuation of the VCO.

SUMMARY OF THE INVENTION

The present invention is intended to overcome the foregoing prior art deficiency, and its prime object is to provide a frequency synthesizer which is highly responsive to frequency switching and also stable against temperature fluctuations.

The inventive frequency synthesizer has its VCO connected with, in addition to a first variable-capacitance diode, a second variable-capacitance diode which determines the VCO frequency, and is further provided with a memory which stores voltage value data indicative of d.c. voltages applied to the second variable-capacitance diode in accordance with the channel data, a voltage detection circuit which measures the output voltage of a filter, a computation circuit which modifies the voltage value data read out of the memory in accordance with the output voltage of the filter, and a conversion circuit which converts the modified data provided by the computation circuit into a corresponding d.c. voltage and applies it to the second variable-capacitance diode.

Furthermore, according to another embodiment, the inventive frequency synthesizer has its VCO connected with, in addition to a first variable-capacitance diode, a second variable-capacitance diode which determines the VCO frequency, and is further provided with a memory which stores voltage value data indicative of d.c. voltages applied to the second variable-capacitance diode in accordance with the channel data, a voltage detection circuit which measures the output voltage of a filter means, a computation circuit which delivers the voltage value data read out of the memory as a voltage setting value and, thereafter, delivers another voltage setting value in accordance with the output value of the filter means, and a conversion circuit which converts the voltage setting value provided by the computation circuit into a d.c. voltage and applies it to the second variable-capacitance diode.

DETAILED DESCRIPTION OF THE PREFERRED EMBODIMENTS

Figure 2:
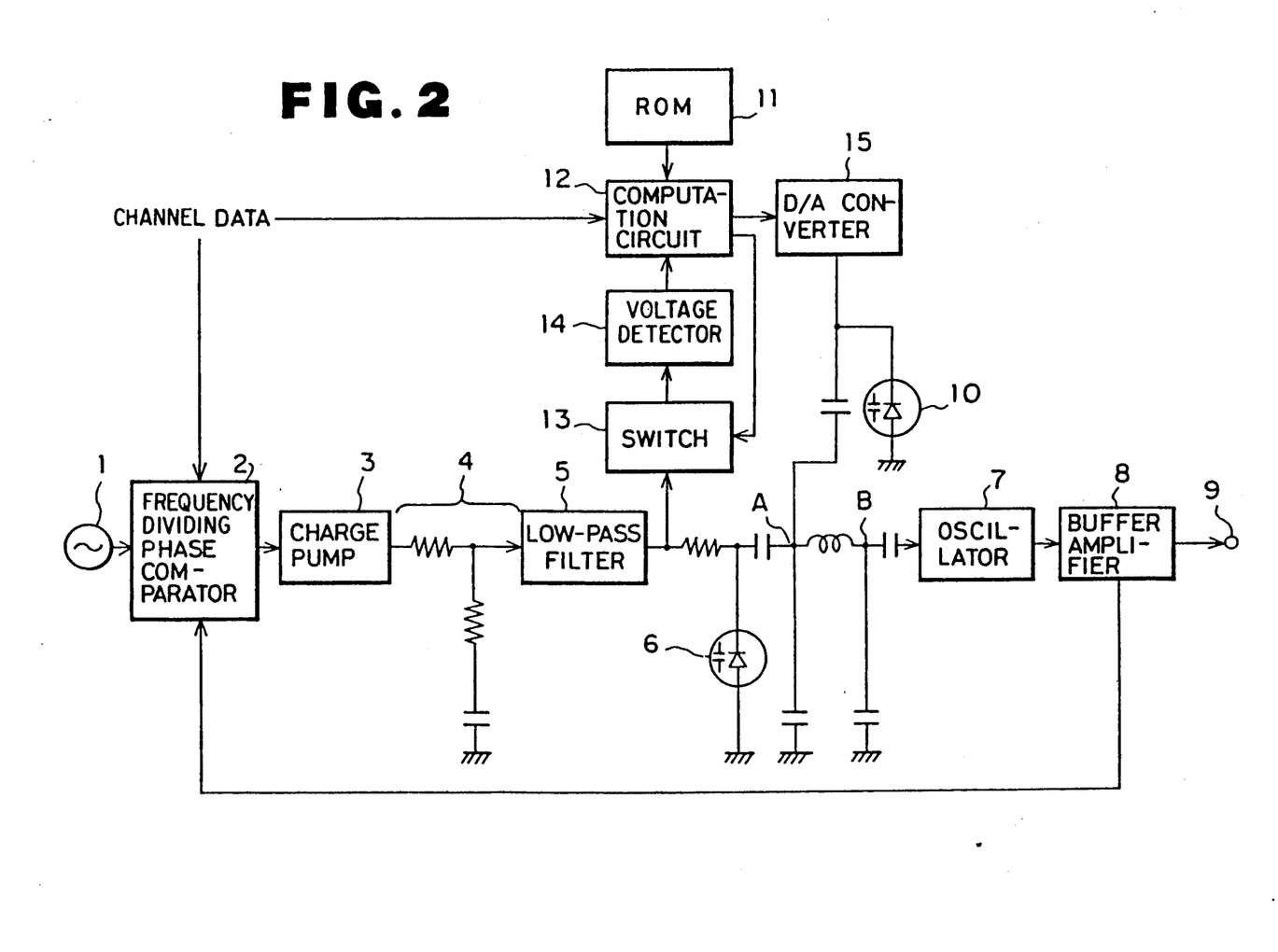
FIG. 2 is a block diagram showing a frequency synthesizer based on a first embodiment of the present invention.

The first embodiment of this invention will be described with reference to the drawings. In FIG. 2, indicated by 1 is a reference signal oscillator, 2 is a frequency dividing phase comparator, 3 is a charge pump, 4 is a lag-lead filter, 5 is a low-pass filter, 6 is a first variable-capacitance diode, 7 is an oscillator, 8 is a buffer amplifier, and 9 is an output terminal. These components are identical or comparable to those referred to by the same symbols in FIG. 1 and their explanation will be omitted.

The arrangement further includes a second variable-capacitance diode 10, which is connected together with the first variable-capacitance diode 6 to the input of the oscillator 7 and functions to determine the oscillation frequency of the oscillator 7. A VCO is formed by the first variable-capacitance diode 6, second variable-capacitance diode 10, and oscillator 7. Indicated by 11 is a read-only memory (will be termed ROM hereinafter) used as a memory for storing in advance the voltage value data for all channels, indicative of d.c. voltages to be applied to the second variable-capacitance diode 10 at a prescribed temperature (e.g., 25° C.) in accordance with the channel data. 12 is a computation circuit consisting of a microprocessor, for example, which operates to modify the voltage value data, which corresponds to the channel data retrieved from the ROM 11, in accordance with the d.c. voltage which has been provided by the low-pass filter 5 at the previous channel switching. 13 is a switch operated to selectively conduct or block the output of the low-pass filter 5. 14 is a voltage detector which evaluates the d.c. voltage provided by the low-pass filter 5, and it includes an A/D converter in this embodiment. 15 is a D/A converter which functions to convert the data provided by the computation circuit 12 into a d.c. voltage and applies it to the second variable-capacitance diode 10.

Next, the operation of the foregoing arrangement will be explained. As in the case of the conventional arrangement, the output signal fed back from the buffer amplifier 8 is divided by the phase comparator 2 and compared in phase with the reference signal produced by the reference signal oscillator 1. In response to a phase difference signal provided by the phase comparator 2, the charge pump 3 operates to generate pulses. These pulses are smoothed by the lag-lead filter 4 and low-pass filter 5, and the resulting d.c. voltage is applied to the first variable-capacitance diode 6. Upon receiving the channel data, the computation circuit 12 addresses the ROM 11 to read out the voltage value data corresponding to the channel data and implements a prescribed computation on the stored voltage value data to produce modified data, which is sent to the D/A converter 15. The D/A converter 15 converts the modified data into a corresponding d.c. voltage, which is applied to the second variable-capacitance diode 10.

The first and second variable-capacitance diodes 6 and 10 have their capacitances established in correspondence to the applied d.c. voltages, and the oscillator 7 oscillates at a frequency determined by the capacitances of the variable-capacitance diodes 6 and 10. Large variations of frequency due to channel switching are accomplished by the capacitance variation of the second variable-capacitance diode 10, and the first variable-capacitance diode 6 performs fine frequency adjustment for the switching frequency. Namely, the d.c. voltage applied to the first variable-capacitance diode 6 varies in a narrow range needed for phase matching in the phase locking process, and consequently it becomes possible to have quick channel switching without the influence of the time constant of the lag-lead filter 4.

Figure 3:
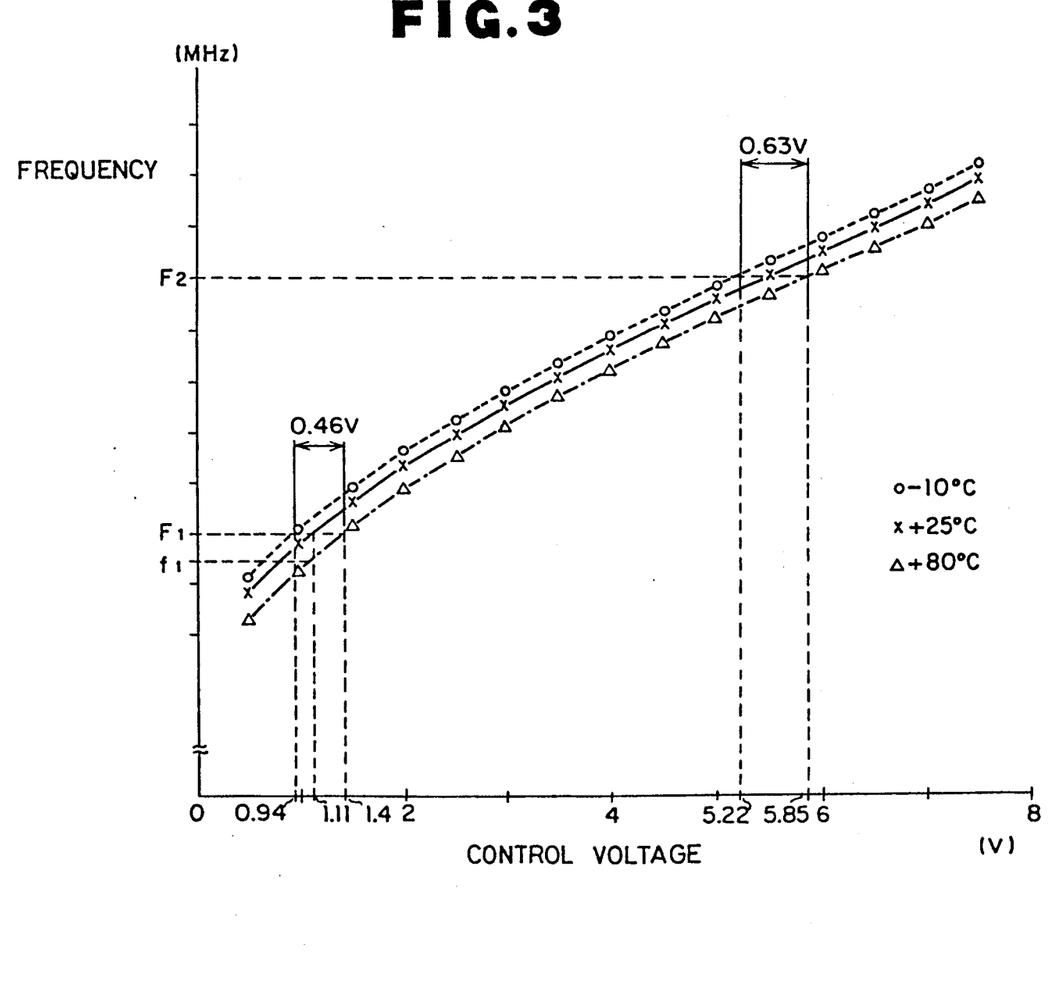
FIG. 3 is a characteristic diagram showing the relation between the control voltage and oscillation frequency of the VCO.

FIG. 3 is a graphical representation of the relation between the control voltage and oscillation frequency of the VCO, with the temperature being a parameter. In the case where it is intended to lock the VCO oscillation frequency to $F_1$ (MHz), the application voltage is 0.94 V at $-10°$ C. or it is 1.4 V at $+80°$ C., having a difference of about 0.46 V. Similarly, locking to $F_2$ (MHz) requires 5.22 V at $-10°$ C. or 5.85 V at $+80°$ C., having a difference of about 0.63 V. Since the ROM 11 stores voltage value data calibrated to $+25°$ C. as mentioned previously, it outputs a voltage of 1.11 V for the frequency locking to $F_1$, corresponding to a temperature of $+25°$ C. If the temperature is $+80°$ C., the VCO initially oscillates at a frequency f1 lower than $F_1$, and thereafter the PLL operates to vary the d.c. voltage applied to the first variable-capacitance diode 6, and eventually the VCO frequency is locked to $F_1$. However, before the VCO frequency is locked to $F_1$, it needs some time length, which is determined from the frequency difference, and therefore the frequency difference must be minimized.

In dealing with this matter, the computation circuit 12, upon receiving the channel data, reads the corresponding voltage value data out of the ROM 11 and performs the calculation of data modification based on the previously measured value (which will be explained later). The modified voltage value data is delivered to the D/A converter 15 and, after the output voltage of the low-pass filter 5 has stabilized, the switch 13 is closed. Consequently, the d.c. voltage which is supplied from the low-pass filter 5 to the first variable-capacitance diode 6 is inputted to the A/D converter of detector 14, which then converts the detected voltage into a digital value. The computation circuit 12 holds the digital value so that it is used as a measured value at the next channel switching. Accordingly, the previous measured value represents the value of the output voltage of the low-pass filter 5 at the previous channel switching. At channel switching, if the previous measured value is the reference value $V_0$ (the voltage value for 25° C. corresponding to the frequency which was set at the previous channel switching), the computation circuit 12 delivers the voltage value data retrieved from the ROM 11 without any modification. If there is a difference in the previously measured value and the reference voltage $V_0$, the computation circuit 12 performs a calculation for modifying the d.c. voltage to be applied to the second variable-capacitance diode 10 according the difference, and delivers the resulting modified data to converter 15. The characteristic diagram of FIG. 3 is assumed to present the relation between the voltage applied to the first variable-capacitance diode 6 and the output signal (the graph is not accurate in a qualitative sense, but it represents the trend). Assuming the setup frequency at the previous channel switching to be $F_1$, with the reference value $V_0$ being 1.11 V and the previously measured value being 1.4 V on the characteristic diagram, the temperature of VCO is inferred to be +80° C. Further assuming the setup frequency at the present channel switching to be $F_2$, the ROM 11 reads out a value corresponding to 5.50 V and a value for +80° C., i.e., a value of 5.85 V, is supplied as modified data to the D/A converter 15 from circuit 12. In this manner, the voltage value data read out of the ROM 11 is modified on the basis of the previously measured value, on the premise that there is no extreme temperature variation from the time of one channel switching to the time of the next channel switching. The computation circuit 12 holds values for −10° C. and +80° C., and the value at any temperature between these temperatures can be obtained by interpolation.

Although in the foregoing embodiment the second variable-capacitance diode 10 is connected on the side of the first variable-capacitance diode 6 as indicated by A in FIG. 2, it may be connected on the side of the oscillator 7 as indicated by B, depending on the sensitivity of the device, and the same effectiveness as of the above embodiment will be achieved.

Figure 4:
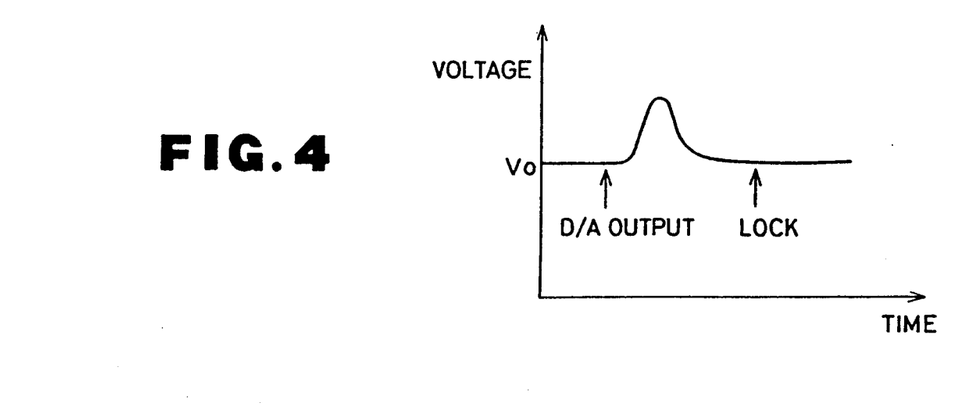
FIG. 4 is a waveform diagram showing the voltage applied to the first variable-capacitance diode.

The time length T needed by the frequency synthesizer for frequency switching is expressed by the following formula.

$$T = T_f + T_p$$

where $T_f$ is the time length until the output signal frequency reaches the final intended frequency, and $T_p$ is the time length after the frequency stabilization until the output signal is in-phase with the reference signal. The frequency synthesizer of the foregoing embodiment is effective for the reduction of $T_f$. However, after the output signal has reached the intended frequency in response to the voltage outputted to the second variable-capacitance diode 10, the frequency synthesizer attempts to achieve phase matching by temporarily shifting the frequency of the output signal. Therefore, as shown in FIG. 4 the voltage applied to the first variable-capacitance diode 6, i.e., the output voltage of the low-pass filter 5, has a fluctuation after a prescribed voltage has been applied to the second variable-capacitance diode 10. The time length from the beginning of the voltage change until the frequency is locked is $T_p$. By reducing even this phase-in time $T_p$, the time needed for frequency switching can further be reduced.

Figure 5:
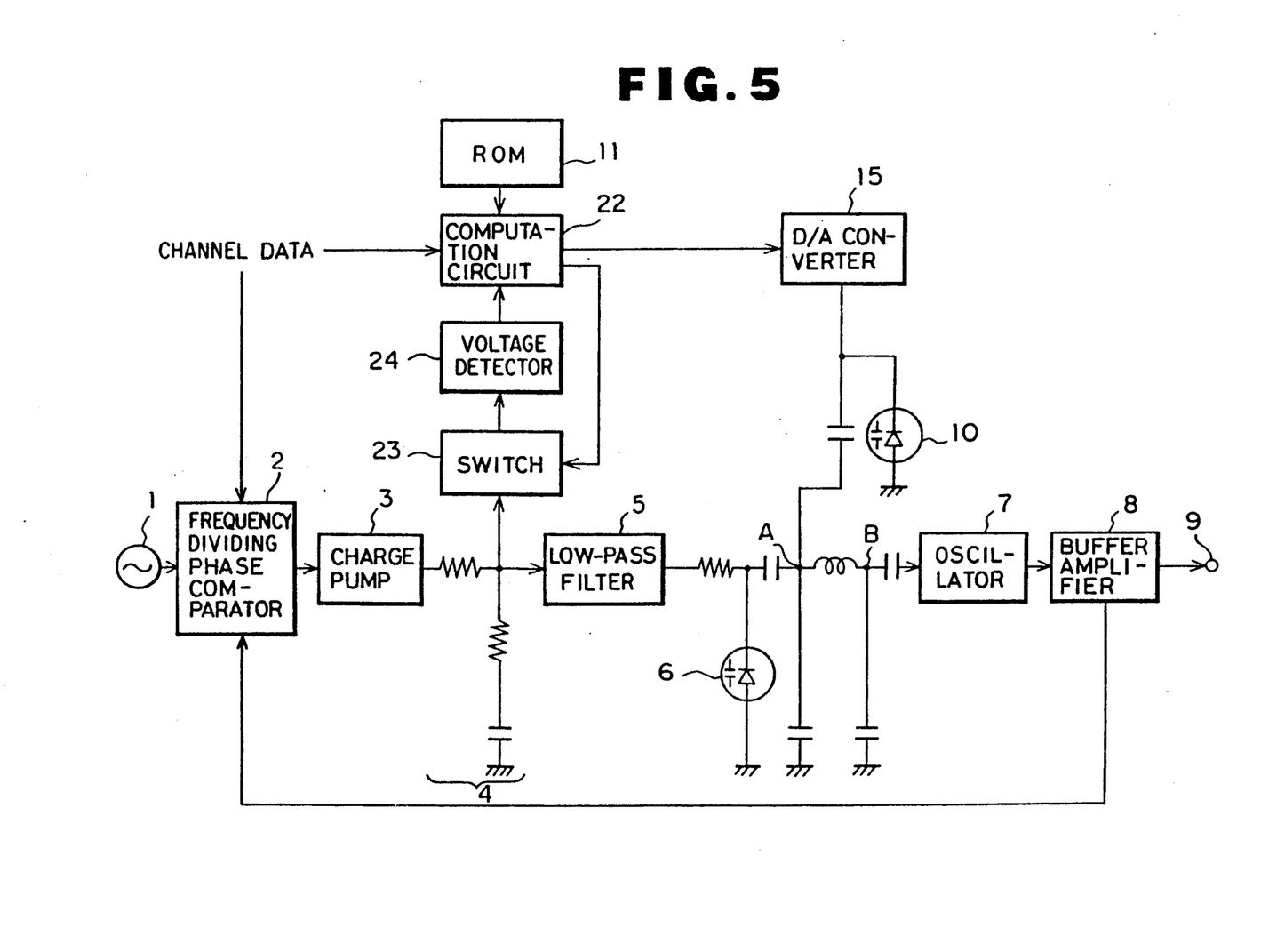
FIG. 5 is a block diagram showing a frequency synthesizer based on a second embodiment of the present invention.

FIG. 5 is a block diagram of a frequency synthesizer according to a second embodiment of this invention which additionally reduces the phase-in time $T_p$. In the figure, indicated by 22 is a computation circuit which outputs the voltage value data read out of the ROM 11 in correspondence with the channel data directly to the D/A converter 15 and outputs the voltage setup value determined according to the output voltage of the lag-lead filter 4 to the D/A converter 15. 23 is a switch, and 24 is an A/D converter which converts the output voltage of the lag-lead filter 4 into a digital value.

Next, the operation of the above arrangement will be explained. In response to the entry of channel data at the time of channel switching, the computation circuit 22 reads the voltage value data corresponding to the entered channel data out of the ROM 11, which is delivered to the D/A converter 15. The D/A converter 15 converts the voltage value data into an analog voltage, which is applied to the second variable-capacitance diode 10. Consequently, the oscillator 7 produces a frequency corresponding to the selected channel.

However, the output frequency signal is generally out of phase with the reference signal, and the frequency dividing phase comparator 2 produces a phase difference signal corresponding to the phase difference therebetween. The lag-lead filter 4 has its output voltage varying in response to the phase difference signal (refer to FIG. 3). The computation circuit 22 then makes the switch 23 conductive. Then, the output voltage of the lag-lead filter 4 is converted into a digital value by the A/D converter 24, which is received by the computation circuit 22. Based on the digital value, the computation circuit 22 can determine whether the PLL system is going to raise or lower the frequency of the output signal. In case the lag-lead filter 4 has a rising output voltage, the PLL system is operating for phase matching through a rise in the output frequency of the oscillator 7. In this case, the computation circuit 22 provides a value larger than the existing voltage value data for the D/A converter 15, resulting in a rise in the output frequency of the oscillator 7. If the rise of the output voltage of the lag-lead filter 4 is sharp, an increased value may be provided for the D/A converter 15. Conversely, in case the lag-lead filter 4 has a falling output voltage, a value smaller than the existing voltage value data is set to the D/A converter 15.

In this manner, the computation circuit 22 swiftly detects the trend of frequency variation of the oscillator 7 implemented by the PLL system to pull-in the phase thereby to apply a voltage accord accords with the detected condition to the second variable-capacitance diode 10 through the D/A converter 15, wherein the output frequency of the oscillator 7 can be varied swiftly. Consequently, the time length for bringing the output signal in-phase with the reference signal is reduced. The switch 23 is made nonconductive when the phase matching is completed, i.e., at the time of phase lock.

The output voltage of the filter 4 may be detected out at the output of the low-pass filter 5; however preferably it is the output of the lag-lead filter 4 which is located in front of low-pass filter 5 which is used in order to detect the output trend of the filter more swiftly.

Figure 6:
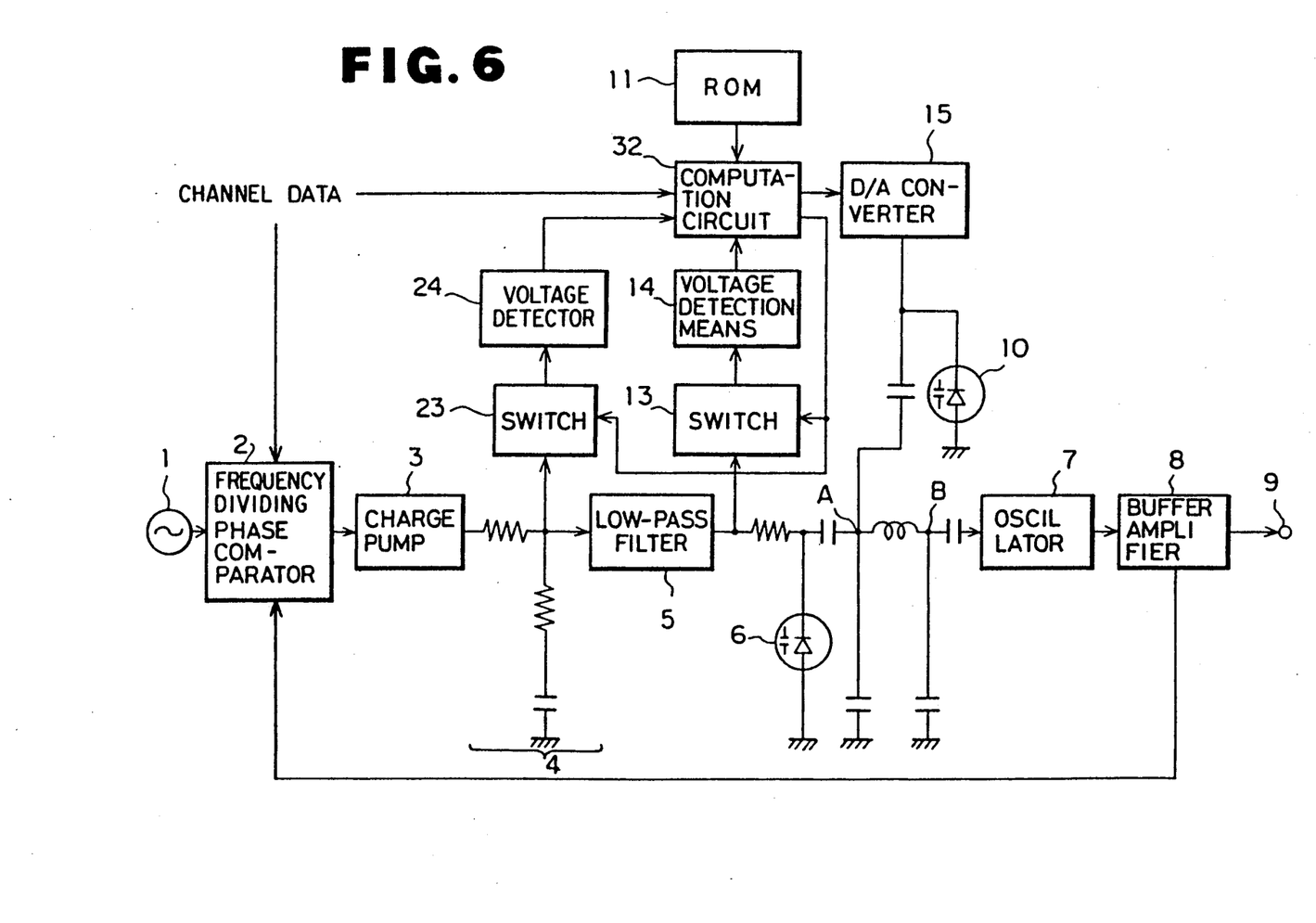
FIG. 6 is a block diagram showing a frequency synthesizer based on a third embodiment of the present invention.

FIG. 6 is a block diagram showing a frequency synthesizer according to a third embodiment of this invention, in which the switch 13 and A/D converter 14 shown in FIG. 2 are added to the arrangement of FIG. 5. In the figure, indicated by 32 is a computation circuit which functions as a combination of both of the computation circuit 12 in FIG. 2 and the computation circuit 22 in FIG. 5.

Next, the operation of this frequency synthesizer will be explained. The computation circuit 32 responds to the entry of channel data at the time of channel switching to implement the modification based on the previous measured value for the voltage value data read out of the ROM 11 through switch 13 and A/D converter 14 as in the first embodiment, and thereafter it delivers the modified data to the D/A converter 15. Subsequently, the computation circuit 32 makes the switch 23 conductive so as to introduce the output voltage value from the lag-lead filter 4, as in the second embodiment. The computation circuit 32 provides a new voltage setup value to the D/A converter 15 in compliance with the output voltage value to the D/A converter 15. Consequently, the output signal is rendered a swift frequency matching and phase matching of the output signal is performed without being affected by the fluctuation of the VCO temperature.

Figure 7:
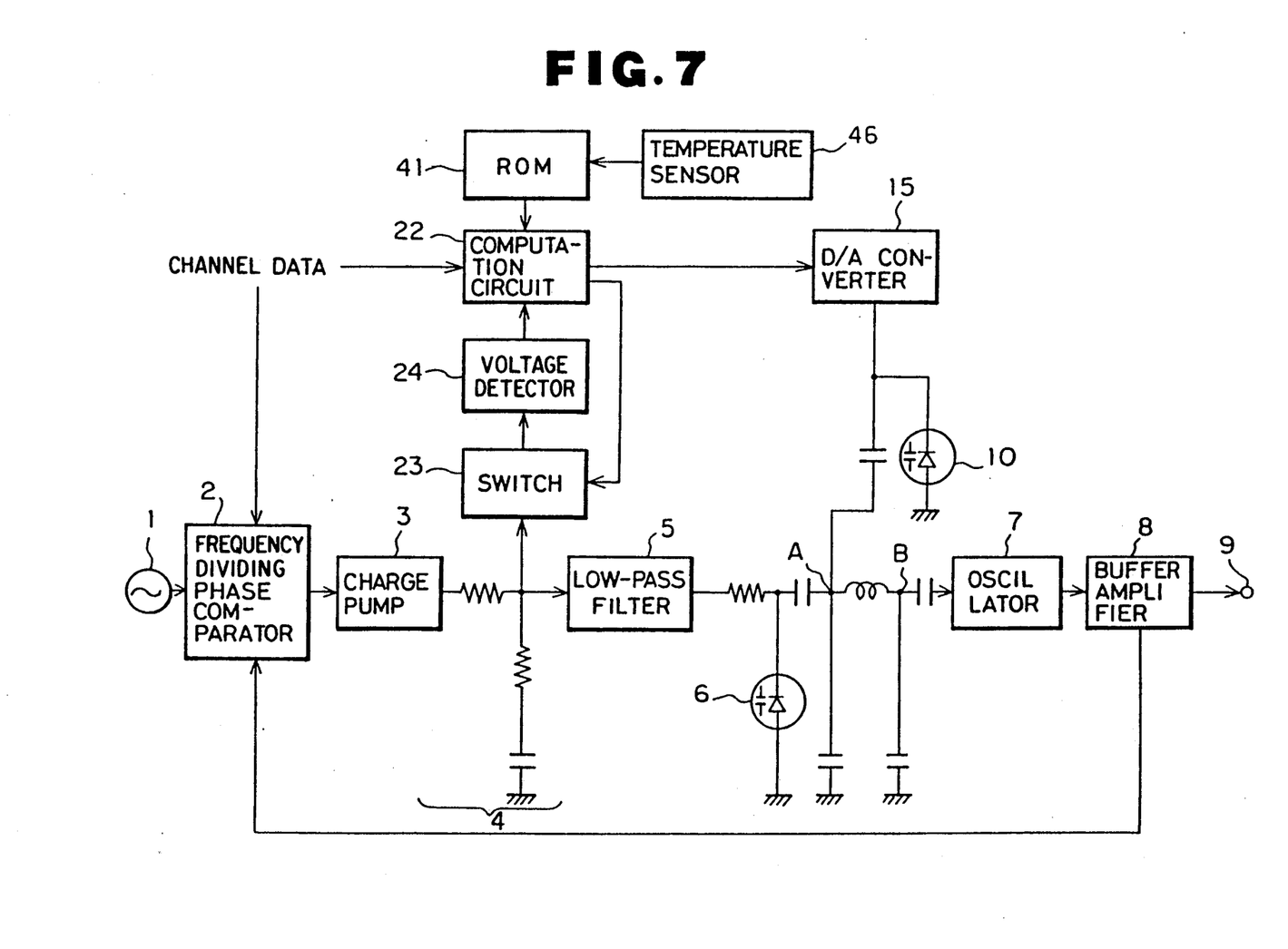
FIG. 7 is a block diagram showing a frequency synthesizer based on a fourth embodiment of the present invention.

FIG. 7 is a block diagram showing a frequency synthesizer according to a fourth embodiment of this invention, in which a temperature sensor 46 is provided for measuring the ambient temperature of the VCO. The ROM 41 stores voltage value data for application of voltage to the second variable-capacitance diode 10 in correspondence to all channel data and to extensive VCO temperatures. The computation circuit 22 responds to the entry of channel data at channel switching time to read the voltage value data for the selected channel data out of the ROM 11. Through the provision of the wiring from the outputs of the temperature sensor 46 (indicative of the immediate temperature) to the address bits of the ROM 11, the computation circuit 22 receives the voltage value data corresponding to the temperature and channel data, allowing the circuit 22 to deliver the voltage value data directly to the D/A converter 15. The subsequent operation is identical to the third embodiment. This arrangement achieves the same effectiveness as of the third embodiment without the need of the A/D converter 14 which serves as a voltage detector.

According to this invention, as described above, the frequency synthesizer is arranged such that the VCO is connected to the second variable-capacitance diode the d.c. voltage across which accords with the modified data based on the output voltage of a filter and derived from the voltage value data read out of the memory in accordance with the channel data, allowing the VCO to switch frequencies without causing a significant fluctuation of the voltage applied to the first variable-capacitance diode, whereby the channel switching time can be reduced and the frequency synthesizer operates stably even in the case of temperature variation.

According to this invention, the frequency synthesizer is arranged such that the VCO is connected with the second variable-capacitance diode which has the application of a d.c. voltage that accords with the voltage value data read out of the memory means in accordance with the channel data, and subsequently a d.c. voltage which accords with another voltage value depending on the output voltage of a filter means is applied to the second variable-capacitance diode, allowing the VCO to have a swift frequency switching and a reduced time length needed for the phase matching between the output signal and reference signal, whereby the frequency synthesizer has a reduced channel switching time.

What is claimed is:

1. A frequency synthesizer, comprising:
   an oscillator which generates an oscillation output signal having a frequency determined by the total capacitance value of a variable capacitance input stage whose capacitance value varies as a function of input d.c. voltage;
   phase comparator means for comparing the phase of a signal proportional to said oscillation output signal with the phase of a reference signal, and outputting a phase difference signal corresponding to the phase difference therebetween;
   filter means for converting said phase difference signal into a first d.c. voltage and applying the first d.c. voltage to one input temrinal of said variable capacitance input stage;
   memory means for storing voltage value data representative of nominal d.c. voltage values to be applied to a second input terminal of said variable capacitance input stage according to the frequency of a channel indicated by channel data inputted to said synthesizer;
   voltage detection means for measuring the value of the d.c. voltage of said filter means and generating a measured signal representative thereof;
   computation means responsive to said channel data and said measured signal for reading nominal d.c. voltage value data from said memory means and modifying the read value data as a function of said measured signal to produce modified voltage value data; and
   conversion means for converting said modified voltage value data into a second d.c. voltage and applying said second d.c. voltage to said second input terminal of said variable capacitance input state.

2. A frequency synthesizer according to claim 1, wherein said memory means stores, for all channels, voltage value data corresponding to d.c. voltages to be applied to said second input terminal diode at a certain temperature.

3. A frequency synthesizer according to claim 2, wherein said computation means holds the value of said measured signal which has been introduced at the previous channel switching, and produces modified data to be used for the present channel switching from the value that has been held and the voltage value data which is read out of said memory means.

4. A frequency synthesizer according to claim 3, wherein said computation means produces modified data which is larger than the voltage value data read out of said memory means if the value that has been held is larger than a certain reference value, and produces modified data which is smaller than said voltage value data if the value that has been held is smaller than a certain reference value.

5. A frequency synthesizer, comprising:
   an oscillator which generates an oscillation output signal having a frequency determined by the total capacitance value of a variable capacitance input stage whose capacitance value varies as a function of input d.c. voltage;
   phase comparator means for comparing the phase of a signal proportional to said oscillation output signal with the phase of a reference signal, and outputting a phase difference signal corresponding to the phase difference therebetween;
   filter means for converting said phase difference signal into a first d.c. voltage and applying the first d.c. voltage to one input terminal of said variable capacitance input stage;
   memory means for storing voltage value data representative of nominal d.c. voltage values to be applied to a second input terminal of said variable capacitance input stage according to the frequency of a channel indicated by channel data inputted to said synthesizer;
   a voltage detection means which measures the output voltage of said filter means;
   conversion means for converting the outputted voltage value data from said computation means into a second d.c. voltage and applying said second d.c. voltage to said second input terminal of said variable capacitance input stage;

voltage detection means for measuring the value of the d.c. voltage of said filter means subsequent to the application of said second d.c. voltage and generating a measured signal representative thereof;

said computation means further being responsive to said measured signal for modifying the read value data as a function of said measured signal to produce modified voltage value data, and said conversion means further converting said modified voltage value data into a modified second d.c. voltage and applying said modified second d.c. voltage to said second input terminal of said variable capacitance input stage.

6. A frequency synthesizer according to claim 5, wherein said computation means produces modified voltage value data which is larger than the voltage value data read from said memory means if the measured signal value has a rising trend, and produces modified voltage value data which is smaller than the voltage value data read from said memory means if the measured signal value has a falling trend.

computation means responsive to said channel data for reading nominal d.c. voltage value data from said memory means and outputting oscillator, read voltage value data;

7. A frequency synthesizer according to claim 5 further comprising a temperature sensor which measures the ambient temperature of said oscillator said temperature sensor having an output value delivered to an address line of said memory means.

8. A frequency synthesizer according to claim 7, wherein said memory means stores voltage value data for all channels and in correspondence to temperature values provided by said temperature sensor.

9. A frequency synthesizer, comprising:

an oscillator which generates an oscillation output signal having a frequency determined by the total capacitance value of a variable capacitance input stage whose capacitance value varies as a function of input d.c. voltage;

phase comparator means for comparing the phase of a signal proportional to said oscillation output signal with the phase of a reference signal, and outputting a phase difference signal corresponding to the phase difference therebetween;

filter means for converting said phase difference signal into a first d.c. voltage and applying the first d.c. voltage to one input terminal of said variable capacitance input stage;

memory means for storing voltage value data representative of nominal d.c. voltage values to be applied to a second input terminal of said variable capacitance input stage according to the frequency of a channel indicated by channel data inputted to said synthesizer;

a computation means which modifies voltage value data read out of said memory means in accordance with the output value provided by said voltage detection means at the previous channel switching thereby to produce modified data, and thereafter produces another voltage setup value in accordance with the output value of said voltage detection means; and conversion means for converting the first modified voltage value data from said computation means into a second d.c. voltage and applying said second d.c. voltage to said second input terminal of said variable capacitance input stage;

said voltage detection means further measuring the value of the d.c. voltage of said filter means subsequent to the application of said second d.c. voltage and generating a second measured signal representative thereof;

said computation means further being responsive to said second measured signal for modifying the read value data as a function of said measured signal to produce second modified voltage value data, and said conversion means further converting said second modified voltage value data into a modified second d.c. voltage and applying said modified second d.c. voltage to said second input terminal of said variable capacitance input stage.

10. A frequency synthesizer according to claim 9, wherein said memory means stores, for all channels, voltage value data corresponding to voltages to be applied to said second input terminal diode at a certain temperature.

11. A frequency synthesizer according to claim 10, wherein said computation means produces modified data which is larger than the voltage value data read out of said memory means if the measured signal value held is larger than a certain reference value, and produces modified data which is smaller than said voltage value data if the measured signal value is smaller than a certain reference value.

12. A frequency synthesizer according to claim 9, wherein said computation means produces second modified voltage value data which is larger than the voltage value data read from said memory means if the second measured signal value has a rising trend, and produces second modified voltage value data which is smaller than the voltage value data read from said memory means if the second measured signal value has a falling trend.

* * * * *